(12) United States Patent
Nam et al.

(10) Patent No.: US 8,012,667 B2
(45) Date of Patent: Sep. 6, 2011

(54) SOFT MOLD AND METHOD OF FABRICATING THE SAME

(75) Inventors: Yeon Heui Nam, Gangwon-Do (KR); Jin-Wuk Kim, Gyeonggi-do (KR)

(73) Assignee: LG Display Co. Ltd., Seoul (KR)

( * ) Notice: Subject to any disclaimer, the term of this patent is extended or adjusted under 35 U.S.C. 154(b) by 426 days.

(21) Appl. No.: 11/818,280

(22) Filed: Jun. 14, 2007

(65) Prior Publication Data
US 2008/0044743 A1 Feb. 21, 2008

(30) Foreign Application Priority Data
Jun. 27, 2006 (KR) .................. 10-2006-0057986

(51) Int. Cl.
*G03F 7/00* (2006.01)
*G03F 7/004* (2006.01)
*G03F 7/027* (2006.01)
*C09K 19/00* (2006.01)

(52) U.S. Cl. ............... 430/270.1; 430/20; 430/281.1; 430/322; 430/913; 428/1.1; 428/1.2

(58) Field of Classification Search .......... 430/20, 430/270.1, 281.1, 913, 322; 428/1.1, 1.2
See application file for complete search history.

(56) References Cited

U.S. PATENT DOCUMENTS

| | | | | |
|---|---|---|---|---|
| 4,439,600 A | * | 3/1984 | Moran, Jr. ............... | 528/392 |
| 5,673,251 A | * | 9/1997 | Suzuki et al. ........... | 369/275.4 |
| 5,995,190 A | * | 11/1999 | Nagae et al. ........... | 349/156 |
| 6,582,862 B1 | * | 6/2003 | Nakamura et al. ...... | 430/7 |
| 7,168,939 B2 | * | 1/2007 | Bietsch et al. .......... | 425/385 |
| 7,198,968 B2 | * | 4/2007 | Chae et al. ............. | 438/30 |
| 7,354,698 B2 | * | 4/2008 | Van Santen et al. .... | 430/311 |
| 7,387,971 B2 | * | 6/2008 | Chae et al. ............. | 438/759 |
| 7,401,552 B2 | * | 7/2008 | Daems et al. ........... | 101/401 |
| 7,501,163 B2 | * | 3/2009 | Kim ........................ | 428/1.1 |
| 7,655,307 B2 | * | 2/2010 | Kim et al. ............... | 428/423.1 |
| 2004/0229120 A1 | * | 11/2004 | Hatta et al. ............. | 429/176 |
| 2005/0084613 A1 | * | 4/2005 | wang et al. ............. | 427/282 |
| 2006/0097414 A1 | * | 5/2006 | Chae et al. ............. | 264/1.27 |

(Continued)

FOREIGN PATENT DOCUMENTS

CN 1774672 5/2006

(Continued)

OTHER PUBLICATIONS

Office Action issued in Japanese Patent Application No. 2007-168248; issued Dec. 15, 2009.

(Continued)

*Primary Examiner* — Amanda C. Walke
(74) *Attorney, Agent, or Firm* — Brinks Hofer Gilson & Lione

(57) ABSTRACT

A soft mold may be manufactured that is used for forming a pattern. Semiconductor devices and flat panel display devices include a plurality of fine patterns on a substrate. The soft mold may be photo-curable and formed of a material with a hydrophobic property similar to heat-curable molds. The photo-curable mold may be created on a master plate with a resin layer that is removed with a back plate and adhesive layer after embossed or depressed portions are formed on the mold that correspond with embossed or depressed portions of the master plate.

15 Claims, 4 Drawing Sheets

U.S. PATENT DOCUMENTS

2006/0131784 A1* 6/2006 Sugimoto .................... 264/293
2007/0262936 A1* 11/2007 Chang et al. .................... 345/87
2008/0000373 A1* 1/2008 Petrucci-Samija
 et al. ......................... 101/401.1
2008/0248205 A1* 10/2008 Blanchet et al. .............. 427/282

FOREIGN PATENT DOCUMENTS

JP  02-130738    5/1990
JP  2004-351693  12/2004
JP  2005-288933  10/2005

OTHER PUBLICATIONS

Office Action issued in corresponding Chinese Patent Application No. 200710104859.7; issued Sep. 11, 2009.

Office Action issued in corresponding Japanese Patent Application No. 2007-168248; issued Mar. 31, 2010.

* cited by examiner
SOFT MOLD AND METHOD OF FABRICATING THE SAME This application claims the benefit of Korean Patent Application No. 2006-0057986, filed in Korea on Jun. 27, 2006, which is hereby incorporated by reference. This application is related the patent application entitled "FABRICATION APPARATUS AND METHOD OF FABRICATING A SOFT MOLD," Ser. No. 11/811,703, filed currently herewith.

BACKGROUND

1. Field of the Disclosure

The present disclosure relates to a mold for forming a pattern.

2. Discussion of the Related Art

Semiconductor devices and flat panel display devices include a plurality of fine patterns on a substrate. A photolithographic method is widely used to form the fine patterns on a substrate, such as wafer or glass. In the photolithographic method, a thin film to be patterned is disposed on a substrate, and a photoresist is applied to the thin film. The photoresist is exposed to light through a photo mask having predetermined patterns. The photoresist is then selectively removed by a developing process to form a photoresist pattern. The thin film is then etched using the photoresist pattern as an etching mask, and the photoresist pattern is removed. Accordingly, a desired pattern is left on the substrate after the photoresist pattern is removed.

However, the photolithographic method is a complicated process that includes exposing and developing, and utilizes an expensive photo mask or exposing apparatus. Production yields may be lowered and manufacturing costs increased as a result of the process. In addition, as patterns are formed to have narrower widths, the production yields may be lowered even further.

As an alternative to the photolithographic method, several methods, including a nano-imprint lithographic method, a soft lithographic method, a capillary force lithographic method, and a soft molding method, have been proposed. In the alternative methods, a soft mold of a high molecular elastic material may be used to form a pattern. A soft lithographic method according to the related art will be described hereinafter with reference to accompanying drawings. In particular, FIGS. 1A to 1F are cross-sectional views illustrating a method for forming a pattern on a substrate using a soft mold according to the related art.

In FIG. 1A, a thin film 11 to be patterned is formed on a substrate 10, and a resist 13 is applied to the thin film 11.

In FIG. 1B, a mold 15, which has depressed portions 17 corresponding to patterns to be formed, is disposed on the resist 13 such that the depressed portions 17 face the thin film 11. The mold 15 is pressed such that a top surface of the mold 15 contacts the thin film 11. Several forces are applied to the resist 13, such as a repulsive force $F_R$ between the mold 15 and the resist 13, a capillary force $F_C$ that causes the resist 13 to be drawn into the depressed portions 17 of the mold 15, a gravity force $F_G$ applied to the resist 13, and a frictional force or adhesion force $F_V$ between the substrate 10 and the resist 13. As a result of all these forces being applied to the resist 13, the overall force F pushing the resist 13 out into the depressed portions 17 of the mold 15 may be expressed by $F_R + F_C - F_G - F_V$. In the soft lithographic method, the mold 15 may be formed of a hydrophobic material so that the mold 15 has a relatively low surface energy. Conversely, the resist 13 may be formed of a hydrophilic material. Accordingly, the repulsive force $F_R$ may result from the surface properties of the mold 15 and the resist 13.

In FIG. 1C, the resist 13 of FIG. 1B is moved into the depressed portions 17 by applying pressure to the mold 15. The resist 13 in the depressed portions 17 is then cured to form resist patterns 13a. The resist patterns 13a correspond to the depressed portions 17 and are created by applying pressure to the mold 15.

In FIG. 1D, the mold 15 is removed after curing the resist 13. The resist patterns 13a remain on the thin film 11 after the curing of the resist 13 and removing the mold 15.

In FIG. 1E, the thin film 11 of FIG. 1D is etched using the resist patterns 13a as an etching mask. The etching results in the formation of patterns 11a that correspond with the resist patterns 13a. The patterns 11a are formed by patterning the thin film 11.

In FIG. 1F, the resist patterns 13a of FIG. 1E are removed by a stripping process. The removal of the resist patterns 13a leaves the patterns 11a on the substrate 10.

Generally, the separation of the mold from the resist pattern may be accomplished easier when the surface energy of the mold is lower than the surface energy of the resist. The surface energy is the energy per unit area required to interface between a solid or liquid phase material and a gas phase material. As the solid or liquid phase material has a larger surface energy, it becomes more difficult to interface with the gas phase material.

Accordingly, in the soft lithographic method, such as with an in-plane printing (IPP) method, to adequately form a predetermined resist pattern, the surface energies of the mold, the resist and the substrate, which may be referred to as $\gamma_{MOLD}$, $\gamma_{ER}$ and $\gamma_{substrate}$, respectively, should satisfy the following relation: $\gamma_{MOLD} < \gamma_{ER} < \gamma_{substrate}$ If the surface energy of the resist $\gamma_{ER}$ is lower than the surface energy of the substrate $\gamma_{substrate}$, the resist may be more easily applied to the substrate. If the surface energy of the resist $\gamma_{ER}$ is higher than the surface energy of the mold $\gamma_{MOLD}$, a repulsive force may be induced between the mold and the resist pattern, and the mold may be more easily separated from the resist pattern. Since the repulsive force of the mold to the resist increases as the surface energy of the mold $\gamma_{MOLD}$ is lowered, it is advantageous for the formation of a pattern to lower the surface energy of the mold $\gamma_{MOLD}$.

Generally, polydimethylsiloxane (PDMS) may be used as a material for the soft mold of the soft lithographic method. In the PDMS mold, uncured chains come out of a surface of the mold, and the PDMS mold keeps a hydrophobic property. Additionally, since the PDMS mold has an elastic property, the PDMS mold may uniformly contact a surface of a substrate to be patterned. The PDMS mold has a relatively low surface energy, and as a result the PDMS mold can be easily detached from the substrate. However, PDMS is heat-curable, and thus the PDMS mold is cured by heat. Accordingly, when the PDMS mold is fabricated, the heat may result in deformations of the mold. In particular, changes in dimensions of mold patterns may be caused due to a shrinking transformation. In addition, PDMS has relatively high viscosity, and as a result, the PDMS material that is deposited through a dispensing method has a relatively large thickness. Further, it may be difficult to reduce the thickness of the PDMS mold.

SUMMARY

In a first aspect, a soft mold includes a photo-curable material and a photo-initiator combined with the photo-curable material. Each surface of the soft mold satisfies an equation $$\left(0.3 \times \frac{\gamma_M^d}{\gamma_L}\right)^{1/2} + \left(0.7 \times \frac{\gamma_M^p}{\gamma_L}\right)^{1/2} \leq 0.5,$$

wherein $\gamma^d_M$ is a dispersion term of a surface energy of the soft mold, $\gamma^p_M$ is a polar term of a surface energy of the soft mold, and $\gamma_L$ is a surface energy of deionized water.

In a second aspect, a method of fabricating a soft mold includes providing a master plate having depressed or embossed portions. A resin layer is disposed on the master plate and cured by irradiating UV light to the resin layer. The cured resin layer is detached from the master plate. Each surface of the soft mold satisfies an equation $$\left(0.3 \times \frac{\gamma_M^d}{\gamma_L}\right)^{1/2} + \left(0.7 \times \frac{\gamma_M^p}{\gamma_L}\right)^{1/2} \leq 0.5,$$

wherein $\gamma^d_M$ is a dispersion term of a surface energy of the soft mold, $\gamma^p_M$ is a polar term of a surface energy of the soft mold, and $\gamma_L$ is a surface energy of deionized water.

In a third aspect, a soft mold for creating a pattern includes a photo-curable material that comprises one or more of diethylene glycol dimethacrylate (DGDMA), ethylene glycol dimethacrylate (EGDMA), ethylene glycol phenyletheracrylate (EGPEA), 2-ethoxy-(2-ethoxy)ethyl acrylate (EOEOEA), 1,6-hexanediol (EO) diacrylate (HD(EO)DA), polyurethane acrylate, glycidyl acrylate, or butyl methacrylate. A photo-initiator is combined with the photo-curable material.

In a fourth aspect, a method for producing a photo-curable soft mold includes disposing a resin layer including a photo-curable material on a master plate that comprises one or more of diethylene glycol dimethacrylate (DGDMA), ethylene glycol dimethacrylate (EGDMA), ethylene glycol phenyletheracrylate (EGPEA), 2-ethoxy-(2-ethoxy)ethyl acrylate (EOEOEA), 1,6-hexanediol (EO) diacrylate (HD(EO)DA), polyurethane acrylate, glycidyl acrylate, or butyl methacrylate. A back plane is contacted with the resin layer, which is cured using a photo-initiator by irradiating ultraviolet light on the resin layer. The resin layer is removed from the master plate to form the photo-curable soft mold.

In a fifth aspect, a method of forming a pattern using a soft mold includes forming a thin film on a substrate, and applying a resist to the thin film on the substrate. A soft mold is disposed on the resist that includes at least one depressed pattern. The soft mold has a hydrophobic property and is removed from the substrate to form at least one desired pattern on the substrate.

It is to be understood that both the foregoing general description and the following detailed description of the present invention are exemplary and explanatory and are intended to provide further explanation of the invention as claimed. Other systems, methods, features and advantages will be, or will become, apparent to one with skill in the art upon examination of the following figures and detailed description. Nothing in this section should be taken as a limitation on those claims. Further aspects and advantages are discussed below in conjunction with the embodiments. Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

BRIEF DESCRIPTION OF THE DRAWINGS

The system and/or method may be better understood with reference to the following drawings and description. Non-limiting and non-exhaustive embodiments are described with reference to the following drawings. The components in the figures are not necessarily to scale, emphasis instead being placed upon illustrating the principles of the invention. In the figures, like referenced numerals designate corresponding parts throughout the different views. The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1A:
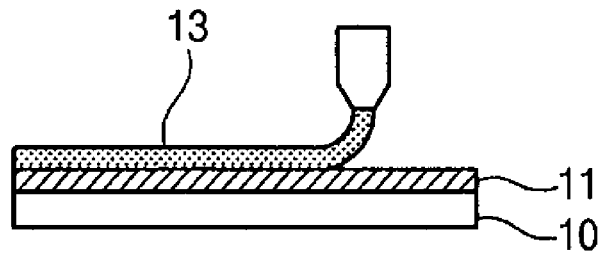
FIGS. 1A to 1F are cross-sectional views illustrating a method for forming a pattern on a substrate using a soft mold according to the related art.
Figure 1B:
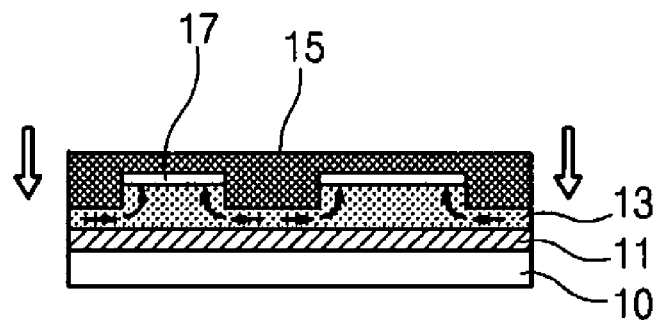
Figure 1C:
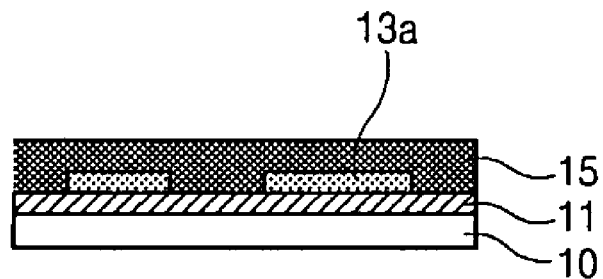
Figure 1D:
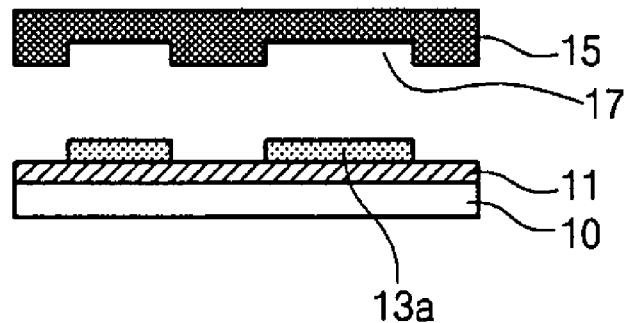
Figure 1E:
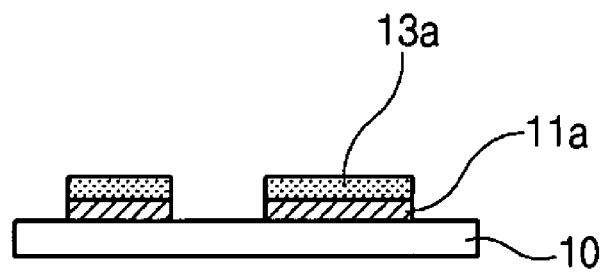
Figure 1F:
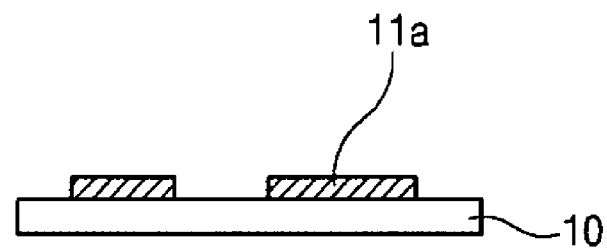

Reference will now be made in detail to the embodiments of the present disclosure, an example of which is illustrated in the accompanying drawings. In the present embodiments, a photo-curable soft mold is proposed rather than a heat-curable soft mold, such as the PDMS mold. The photo-curable soft mold according to the present embodiments may be formed of one or more material selected from diethylene glycol dimethacrylate (DGDMA), ethylene glycol dimethacrylate (EGDMA), ethylene glycol phenyletheracrylate (EGPEA), 2-ethoxy-(2-ethoxy)ethyl acrylate (EOEOEA), 1,6-hexanediol (EO) diacrylate (HD(EO)DA), polyurethane acrylate, glycidyl acrylate, and butyl methacrylate. The materials have a relatively low viscosity. A photo-initiator may be added to the selected material. In one embodiment, the photo-initiator may be one of IRGACURE 369, IRGACURE 184 or IRGACURE 379 of Ciba Specialty Chemicals.

In the present embodiments, the photo-curable soft mold made of the above-mentioned material satisfies a condition defined by equation (1) such that the photo-curable soft mold has a similar value for its surface energy as that of the heat-curable soft mold made of PDMS.

$$\left(0.3 \times \frac{\gamma_M^d}{\gamma_L}\right)^{1/2} + \left(0.7 \times \frac{\gamma_M^p}{\gamma_L}\right)^{1/2} \leq 0.5 \qquad \text{equation (1)}$$

As defined in equation (1), $\gamma_M$ is a surface energy of the soft mold and $\gamma_L$ is a surface energy of deionized water. In addition, $\gamma^d$ is a dispersion term and $\gamma^p$ is a polar term. Hereinafter, the left side of the equation (1) may be referred to as a coefficient A.

The equation (1) is derived from the following equations:

$$\gamma_{ML} = \gamma_M - \gamma_L \cos\theta \qquad \text{equation (2)}$$

$$\gamma_{ML} = \gamma_M + \gamma_L - W_a \qquad \text{equation (3)}$$

The equation (2) is Young's equation, and equation (3) is Good-Girifalco's theory. In equation (3), Wa is a work of adhesion. The following equation (4) is derived from equations (2) and (3):

$$\gamma_L(1+\cos\theta)=W_a \qquad \text{equation (4)}$$

In general, a surface is regarded as hydrophobic when a contact angle of a water droplet on it is larger than 90 degrees. Therefore, the following equation (5) must be satisfied to establish that the surface of the soft mold has a hydrophobic property.

$$(1+\cos\theta)=\frac{W_a}{\gamma_L} \le 1 \qquad \text{equation (5)}$$

If the following equation (6) for Owens and Wendt's hypothesis is substituted for equation (5), then equation (1) may be derived.

$$W_a = 2(\gamma_L^d \gamma_M^d)^{1/2} + 2(\gamma_L^p \gamma_M^p)^{1/2} \qquad \text{equation (6)}$$

Accordingly, in equation (1), the coefficient A is determined by the dispersion term $\gamma^d$ and the polar term $\gamma^p$ of the surface energy. A method of fabricating a photo-curable soft mold using a material satisfying the above-mentioned conditions will be described hereinafter with reference to accompanying drawings. FIGS. 2A to 2F are cross-sectional views illustrating a method of fabricating a photo-curable soft mold according to one embodiment.

Figure 2A:
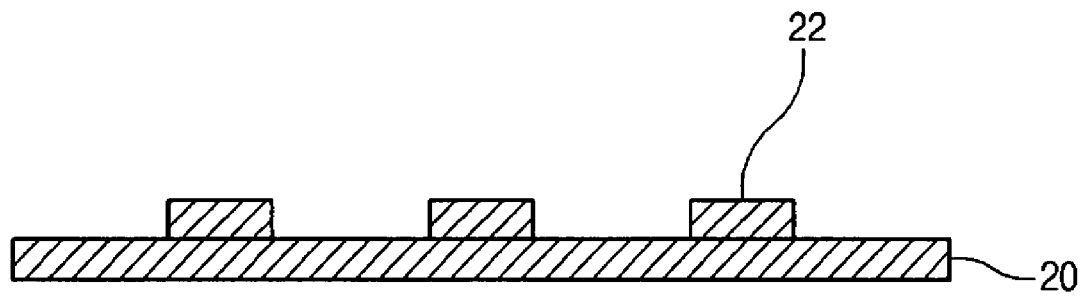
FIGS. 2A to 2F are cross-sectional views illustrating a method of fabricating a photo-curable soft mold according to one embodiment.

In FIG. 2A, a master plate 20 is prepared. The master plate 20 has predetermined embossed portions 22 on its surface. The master plate 20 may have depressed portions, rather than embossed portions 22. Alternatively, the portions between embossed portions 22 may be referred to as depressed portions. The master plate 20 may be formed by depositing an insulating layer, such as silicon nitride or silicon oxide, on an insulating substrate. The insulating layer may then be patterned through a photolithographic process in one example. Alternatively, the master plate 20 may be formed by selectively patterning the surface of the master plate 20.

Figure 2B:
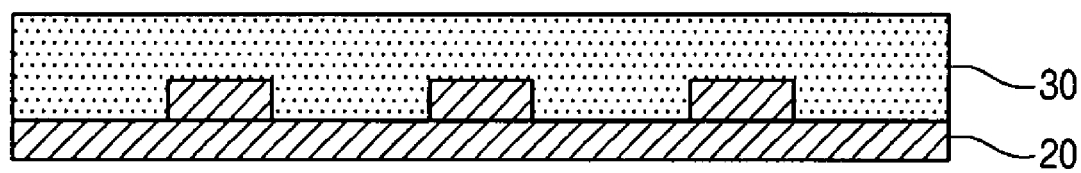

In FIG. 2B, a resin layer 30 is formed on the master plate 20. The resin layer 30 may include at least one material selected from diethylene glycol dimethacrylate (DGDMA), ethylene glycol dimethacrylate (EGDMA), ethylene glycol phenyletheracrylate (EGPEA), 2-ethoxy-(2-ethoxy)ethyl acrylate (EOEOEA), 1,6-hexanediol (EO) diacrylate (HD(EO)DA), polyurethane acrylate, glycidyl acrylate, or butyl methacrylate. In one embodiment, the resin layer 30 is chosen to satisfy the equation (1). Additionally, since the resin layer 30 is cured by UV light, the resin layer 30 may include a photo-initiator. The photo-initiator may be used to improve the curing of the resin layer 30 by the UV light.

Figure 2C:
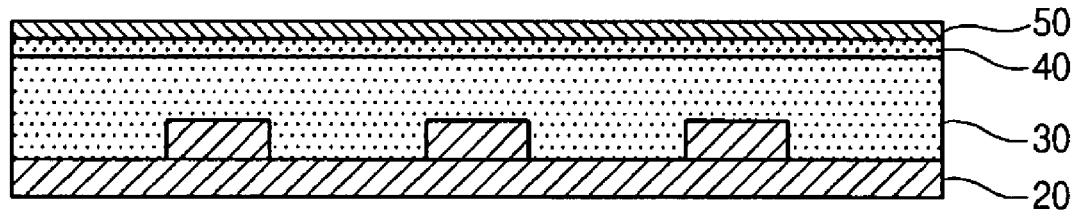

In FIG. 2C, a back-plane 50 is coupled with a top surface of the resin layer 30. Herein, the phrase "coupled with" is defined to mean directly connected to or indirectly connected through one or more intermediate components. In one embodiment, an adhesive material 40 may be applied to a surface of the back-plane 50. The surface of the back-plane 50 with the adhesive is contacted with the top surface of the resin layer 30. The adhesive material 40 may operate to couple the resin layer 30 with the back-plane 50. In alternative embodiments, the attaching of the back-plane 50 may be omitted.

The back-plane 50 may be formed of a transparent material, such as glass, quartz, polyethyleneterephthalate (PET), polymethylmethacrylated (PMMA), or polycarbonate (PC). In one example, the adhesive may be EC-2320 of 3M Co., Ltd. The adhesive material 40 may be formed on the back-plane 50 by a spray coating method, a spin coating method, a slit coating method or a bar coating method.

Figure 2D:
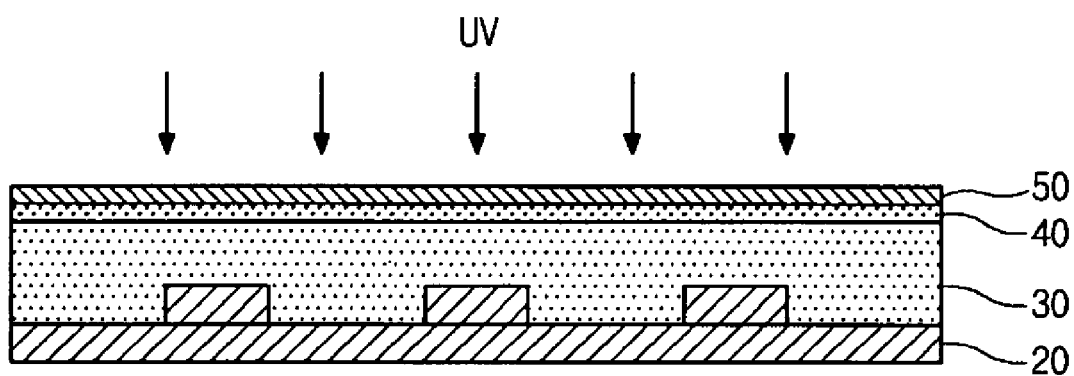

In FIG. 2D, UV light is irradiated on the resin layer 30 to cure the resin layer 30. The resin layer 30 is cured by activating physical cross-linking reactions of linear chain polymers due to the photo-initiator. As described above, a photo-initiator applied to the resin layer 30 may be used to improve the curing of the resin layer 30 by UV light.

Figure 2E:
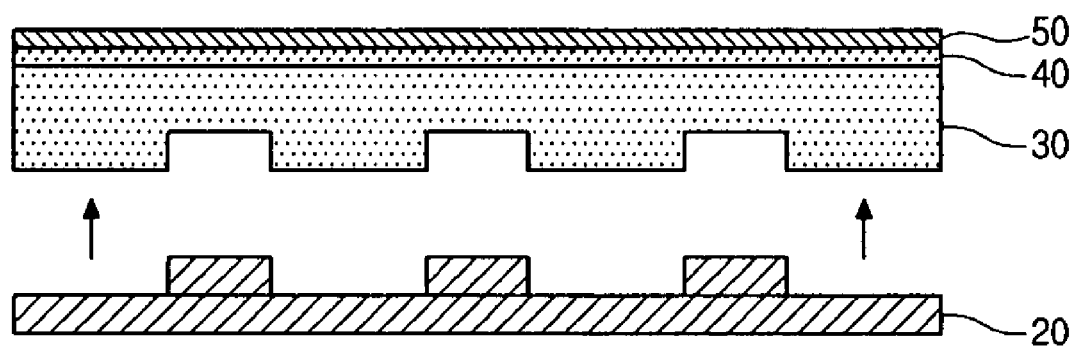
Figure 2F:
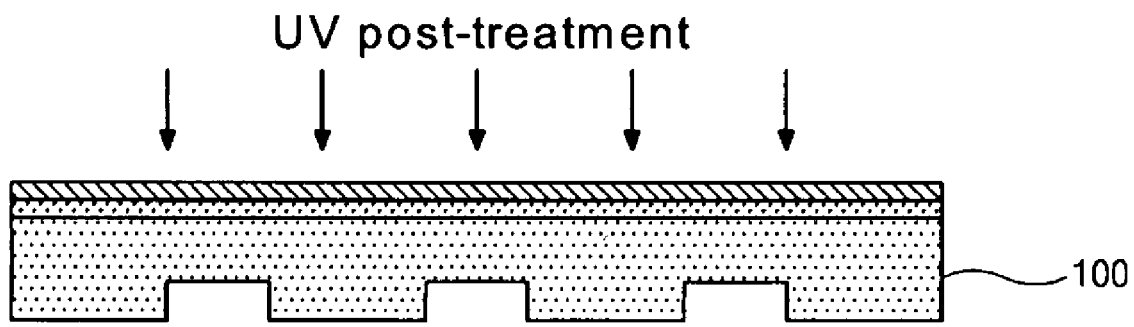

In FIG. 2E, the cured resin layer 30 with the back-plane 50 is detached from the master plate 20, and thus, in FIG. 2F, a soft mold 100 is completed. In particular, the back-plane 50 may be removed from the master plate 20 and because the adhesive material bonds the resin layer 30 with the back-plane 50, the removal of the back-plane 50 also removes the resin layer. The back-plane 50 with the resin layer 30 forms the soft mold 100 as shown in FIG. 2F. The soft mold 100 has depressed or embossed portions, which correspond to the embossed or depressed portions of the master plate 20 of FIG. 2E. To strengthen the hydrophobic property of the soft mold 100, a post-treatment process may be performed using UV light on the soft mold 100. In the post-treatment process, the intensity of the UV light may be within a range of 2 to 15 mW/cm², and the irradiation time may be within a range of 10 seconds to 20 minutes in one embodiment.

For example, when the UV light having an intensity of about 11 mW/cm² is irradiated to the soft mold for about 5 minutes, the soft mold has a dispersion term of the surface energy of about 20.8 and a polar term of the surface energy of about 2.6. Accordingly, the coefficient A of the soft mold is about 0.45 with the above dispersion and polar values. The coefficient A of the soft mold is similar to that of a heat-curable soft mold, such as a PDMS. A heat-curable soft mold which is made of PDMS may have a dispersion term of the surface energy of about 18.8, a polar term of the surface energy of about 1.6, and the resulting coefficient A becomes about 0.4. Alternatively, another photo-curable soft mold made of polyurethane may have a coefficient A of about 0.6 and does not possess the hydrophobic property.

In the present embodiments, since the soft mold is photo-curable, dimensions of the mold patterns are not deformed by the process of curing. In addition, the soft mold is formed of one or more materials having a similar hydrophobic property to a heat-curable soft mold, such as a mold made from PDMS. Finally, the soft mold may be easily detached from a substrate for forming desired patterns. Because the material for the soft mold has relatively low viscosity, the soft mold may be created with a small thickness of several micrometers and a lighter weight.

It will be apparent to those skilled in the art that various modifications and variations can be made in the soft mold for an in-plane printing process that a method of manufacturing the same of the present invention without departing from the spirit or scope of the invention. The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive. The above disclosed subject matter is to be considered illustrative, and not restrictive, and the appended claims are intended to cover all such modifications, enhancements, and other embodiments, which fall within the true spirit and scope of the present invention.

What is claimed is:

1. A soft mold, comprising:
   a UV light cured product of a resin layer, the resin layer including a photo-curable material; and a photo-initiator combined with the photo-curable material
   wherein the soft mold is treated in a post-treatment process using UV light such that each surface of the soft mold satisfies an equation $$\left(0.3 \times \frac{\gamma_M^d}{\gamma_L}\right)^{1/2} + \left(0.7 \times \frac{\gamma_M^p}{\gamma_L}\right)^{1/2} \leq 0.5,$$

wherein $\gamma_M^d$ is a dispersion term of a surface energy of the soft mold, $\gamma_M^p$ is a polar term of a surface energy of the soft mold, and $\gamma_L$ is a surface energy of deionized water.
   wherein the photo-curable material is one or more selected from diethylene glycol dimethacrylate (DGDMA), ethylene glycol dimethacrylate (EGDMA), ethylene glycol phenyletheracrylate (EGPEA), 2-ethoxy-(2-ethoxy) ethyl acrylate (EOEOEA), 1,6-hexanediol (EO) diacrylate (HD(EO)DA), polyurethane acrylate, glycidyl acrylate, or butyl methacrylate.

2. The soft mold according to claim 1, wherein the photo-initiator is used while ultraviolet (UV) light is irradiated at the soft mold for curing.

3. The soft mold according to claim 1, wherein each surface of the soft mold has a hydrophobic property.

4. A method of fabricating a soft mold, comprising:
   providing a master plate having depressed or embossed portions;
   disposing a resin layer on the master plate;
   curing the resin layer by irradiating UV light to the resin layer;
   detaching the cured resin layer from the master plate to thereby form the soft mold; and
   irradiating UV light to the soft mold after detaching the cured resin layer from the master plate such that each surface of the soft mold satisfies an equation $$\left(0.3 \times \frac{\gamma_M^d}{\gamma_L}\right)^{1/2} + \left(0.7 \times \frac{\gamma_M^p}{\gamma_L}\right)^{1/2} \leq 0.5,$$

wherein $\gamma_M^d$ is a dispersion term of a surface energy of the soft mold, $\gamma_M^p$ is a polar term of a surface energy of the soft mold, and $\gamma_L$ is a surface energy of deionized water,
   wherein the resin layer includes a photo-curable material and a photo-initiator
   wherein the photo-curable material is one or more selected from diethylene glycol dimethacrylate (DGDMA), ethylene glycol dimethacrylate (EGDMA), ethylene glycol phenyletheracrylate (EGPEA), 2-ethoxy-(2-ethoxy) ethyl acrylate (EOEOEA), 1,6-hexanediol (EO) diacrylate (HD(EO)DA), polyurethane acrylate, glycidyl acrylate, and butyl methacrylate.

5. The method according to claim 4, wherein the UV light irradiating the soft mold after detaching the cured resin layer has an intensity of about 2 mW/cm² to about 15 mW/cm².

6. The method according to claim 4, wherein the UV light irradiating the soft mold after detaching the cured resin layer is irradiated to the soft mold for about 10 seconds to about 20 minutes.

7. The method according to claim 4, further comprising a step of attaching a back-plane including an adhesive material to the resin layer such that the adhesive material contacts the resin layer after applying the resin layer on the master plate.

8. A soft mold for creating a pattern comprising:
   a UV light cured product of a resin layer, the resin layer including a photo-curable material, wherein the photo-curable material comprises one or more of diethylene glycol dimethacrylate (DGDMA), ethylene glycol dimethacrylate (EGDMA), ethylene glycol phenyletheracrylate (EGPEA), 2-ethoxy-(2-ethoxy)ethyl acrylate (EOEOEA), 1,6-hexanediol (EO) diacrylate (HD(EO)DA), polyurethane acrylate, glycidyl acrylate, or butyl methacrylate; and a photo-initiator combined with the photo-curable material,
   wherein the soft mold is treated in a post-treatment process using UV light such that each surface of the soft mold has a hydrophobic property.

9. A method for producing a photo-curable soft mold comprising:
   disposing a resin layer including a photo-curable material on a master plate, wherein the photo-curable material comprises one or more of diethylene glycol dimethacrylate (DGDMA), ethylene glycol dimethacrylate (EGDMA), ethylene glycol phenyletheracrylate (EGPEA), 2-ethoxy-(2-ethoxy)ethyl acrylate (EOEOEA), 1,6-hexanediol (EO) diacrylate (HD(EO)DA), polyurethane acrylate, glycidyl acrylate, or butyl methacrylate;
   contacting a back plane with the resin layer;
   curing the resin layer using a photo-initiator by irradiating ultraviolet light on the resin layer;
   removing the resin layer from the master plate to form the photo-curable soft mold; and
   irradiating UV light to the photo-curable soft mold after removing the resin layer from the master plate such that each surface of the photo-curable soft mold has a hydrophobic property.

10. The method of claim 9, wherein the hydrophobic property includes satisfying the equation:

$$\left(0.3 \times \frac{\gamma_M^d}{\gamma_L}\right)^{1/2} + \left(0.7 \times \frac{\gamma_M^p}{\gamma_L}\right)^{1/2} \leq 0.5,$$

wherein $\gamma_M^d$ is a dispersion term of a surface energy of the soft mold, $\gamma_M^p$ is a polar term of a surface energy of the soft mold, and $\gamma_L$ is a surface energy of deionized water.

11. A method of forming a pattern using a soft mold comprising:
   forming a thin film on a substrate;
   applying a resist to the thin film on the substrate;
   disposing a soft mold on the resist, wherein the soft mold includes at least one depressed pattern, further wherein the soft mold comprises a UV light cured product of a resin layer, the resin layer including a photo-curable material and a photo-initiator, wherein the soft mold is treated in a post-treatment process using UV light such that the soft mold has a hydrophobic property, wherein the photo-curable material is one or more selected from diethylene glycol dimethacrylate (DGDMA), ethylene glycol dimethacrylate (EGDMA), ethylene glycol phenyletheracrylate (EGPEA), 2-ethoxy-(2-ethoxy)ethyl acrylate (EOEOEA), 1,6-hexanediol (EO) diacrylate (HD(EO)DA), polyurethane acrylate, glycidyl acrylate, or butyl methacrylate; and removing the soft mold from the substrate to form at least one desired pattern on the substrate.

12. The method of claim 11 further comprising:
curing the resist with light to form at least one resist pattern corresponding to the at least one depressed pattern;
etching the thin film with the at least one resist pattern as a mask leaving the at least one desired pattern of the thin film, the at least one desired pattern corresponding to the at least one resist pattern; and
removing the at least one resist pattern leaving the at least one desired pattern on the substrate.

13. The method of claim 12 wherein the curing the resist with light comprises irradiating ultraviolet (UV) light on the soft mold, wherein the UV light has an intensity of about 2 $mW/cm^2$ to about 15 $mW/cm^2$ and is irradiated for about 10 seconds to about 20 minutes.

14. The method of claim 11 wherein the resist is drawn into the at least one depressed pattern by a repulsive force between the soft mold and the resist.

15. The method of claim 11 wherein each surface of the soft mold has a hydrophobic property.

\* \* \* \* \*